(12) United States Patent
Budhia et al.

(10) Patent No.: US 10,377,255 B2
(45) Date of Patent: Aug. 13, 2019

(54) METHODS AND APPARATUS FOR REDUCING FLUX CANCELLATION IN FERRITE OF DOUBLE COUPLE INDUCTIVE POWER TRANSFER SYSTEMS

(71) Applicant: WiTricity Corporation, Watertown, MA (US)

(72) Inventors: Mickel Bipin Budhia, Auckland (NZ); Chang-Yu Huang, Auckland (NZ); Nicholas Athol Keeling, Munich (DE); Michael Le Gallais Kissin, Auckland (NZ); Jonathan Beaver, Auckland (NZ)

(73) Assignee: WiTricity Corporation, Watertown, MA (US)

( * ) Notice: Subject to any disclaimer, the term of this patent is extended or adjusted under 35 U.S.C. 154(b) by 504 days.

(21) Appl. No.: 15/154,286

(22) Filed: May 13, 2016

(65) Prior Publication Data

US 2017/0326992 A1 Nov. 16, 2017

(51) Int. Cl.

| | |
|---|---|
| *B60L 53/12* | (2019.01) |
| *B60L 11/18* | (2006.01) |
| *B60L 5/00* | (2006.01) |
| *H01F 27/24* | (2006.01) |
| *H01F 27/40* | (2006.01) |
| *H01F 38/14* | (2006.01) |

(Continued)

(52) U.S. Cl.
CPC .............. *B60L 11/182* (2013.01); *B60L 5/005* (2013.01); *B60L 53/12* (2019.02); *H01F 27/24* (2013.01);

(Continued)

(58) Field of Classification Search
CPC ............................... B60L 11/182; B60L 53/12
(Continued)

(56) References Cited

U.S. PATENT DOCUMENTS

| | | | | |
|---|---|---|---|---|
| 4,087,701 A | * | 5/1978 | Anderson ................ | H04B 3/56 307/149 |
| 5,293,308 A | * | 3/1994 | Boys ....................... | H02J 5/005 363/37 |

(Continued)

FOREIGN PATENT DOCUMENTS

WO WO-2015162081 A2 10/2015

OTHER PUBLICATIONS

Kacprzak D., et al., "An Improved Magnetic Design for Inductively Coupled Power Transfer System Pickups," Faculty of Engineering Papers, 2005, 5 pages.

(Continued)

*Primary Examiner* — Jerry D Robbins
(74) *Attorney, Agent, or Firm* — Knobbe Martens Olson & Bear LLP

(57) ABSTRACT

According to some implementations, an apparatus for transmitting charging power wirelessly to a load is provided. The apparatus comprises at least one ferrite structure comprising a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg. The at least one ferrite structure further comprises a coil wound around the second ferrite leg and configured to generate an alternating current under influence of an alternating magnetic field.

30 Claims, 9 Drawing Sheets

(51) Int. Cl.

| | | |
|---|---|---|
| *H01F 41/02* | (2006.01) | |
| *H01F 41/06* | (2016.01) | |
| *H02J 7/02* | (2016.01) | |
| *H03H 7/38* | (2006.01) | |
| *H02J 7/00* | (2006.01) | |
| *H02J 50/10* | (2016.01) | |
| *H02J 50/40* | (2016.01) | |
| *H02J 50/12* | (2016.01) | |
| *H02J 50/50* | (2016.01) | |

(52) U.S. Cl.
CPC ............ *H01F 27/40* (2013.01); *H01F 38/14* (2013.01); *H01F 41/0206* (2013.01); *H01F 41/06* (2013.01); *H02J 7/0042* (2013.01); *H02J 7/025* (2013.01); *H02J 50/10* (2016.02); *H02J 50/12* (2016.02); *H02J 50/40* (2016.02); *H02J 50/50* (2016.02); *H03H 7/38* (2013.01); *Y02T 10/7005* (2013.01); *Y02T 10/7072* (2013.01); *Y02T 90/122* (2013.01); *Y02T 90/14* (2013.01)

(58) Field of Classification Search
USPC ........................................................ 320/108
See application file for complete search history.

(56) References Cited

U.S. PATENT DOCUMENTS

| | | | |
|---|---|---|---|
| 5,528,113 A * | 6/1996 | Boys | B60L 11/1812 318/16 |
| 5,790,005 A | 8/1998 | Santi et al. | |
| 6,515,878 B1 | 2/2003 | Meins et al. | |
| 2004/0085174 A1* | 5/2004 | Decristofaro | H01F 3/14 336/178 |
| 2005/0047175 A1* | 3/2005 | Kawasaki | H02M 3/33569 363/16 |
| 2007/0279062 A1* | 12/2007 | Greim | G01R 33/3415 324/322 |
| 2008/0088399 A1 | 4/2008 | Mayo | |
| 2009/0251937 A1* | 10/2009 | Schmidt | H02M 7/48 363/131 |
| 2010/0259217 A1* | 10/2010 | Baarman | H02J 5/005 320/108 |
| 2011/0031928 A1* | 2/2011 | Soar | F41G 1/34 320/108 |
| 2012/0186927 A1* | 7/2012 | Suh | B60L 11/1803 191/10 |
| 2016/0049881 A1* | 2/2016 | Ackermann | H01F 3/14 315/200 R |
| 2016/0068070 A1 | 3/2016 | Huang et al. | |

OTHER PUBLICATIONS

Kim J., et al., "Coil Design and Shielding Methods for a Magnetic Resonant Wireless Power Transfer System," Proceedings of the IEEE, Jun. 2013, vol. 101 (6), pp. 1332-1342.
International Search Report and Written Opinion—PCT/US2017/029676—ISA/EPO—dated Jul. 12, 2017.

* cited by examiner

METHODS AND APPARATUS FOR REDUCING FLUX CANCELLATION IN FERRITE OF DOUBLE COUPLE INDUCTIVE POWER TRANSFER SYSTEMS

FIELD

This application is generally related to wireless power charging of chargeable devices such as electric vehicles and more specifically to methods and apparatuses for reducing flux cancellation in the ferrite of double couple inductive power transfer systems.

BACKGROUND

Remote systems, such as vehicles, have been introduced that include locomotion power derived from electricity received from an energy storage device, such as a battery. For example, hybrid electric vehicles include on-board chargers that use power from vehicle braking and traditional motors to charge the vehicles. Vehicles that are solely electric generally receive the electricity for charging the batteries from other sources. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless power charging systems that are capable of transferring power in free space (e.g., via a wireless field) to be used to charge electric vehicles may overcome some of the deficiencies of wired charging solutions. As such, wireless power charging systems and methods that efficiently and safely transfer power for charging electric vehicles are desirable.

Inductive power transfer (IPT) systems are one means for the wireless transfer of energy. In IPT, a primary (or "base") power device transmits power to a secondary (or "pick-up") power receiver device. Each of the transmitter and receiver power devices include inductors, typically coils or windings of electric current conveying media. An alternating current in the primary inductor produces a fluctuating magnetic field. When the secondary inductor is placed in proximity to the primary inductor, the fluctuating magnetic field induces an electromotive force (EMF) in the secondary inductor, thereby transferring power to the secondary power receiver device.

SUMMARY

According to some implementations, an apparatus for transmitting charging power wirelessly to a load is provided. The apparatus comprises at least one ferrite structure comprising a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg. The at least one ferrite structure further comprises a coil wound around the second ferrite leg and configured to generate an alternating current under influence of an alternating magnetic field.

In some other implementations, a method for transmitting charging power wirelessly to a load is provided. The method comprises generating an alternating current via a first coil under influence of a first alternating magnetic field, the first coil wound around at least one portion of a ferrite structure comprising a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg. The method further comprises wirelessly transmitting power via a second alternating magnetic field generated by driving a second coil with the alternating current.

In yet some other implementations an apparatus for transmitting charging power wirelessly to a load is provided. The apparatus comprises first means for channeling magnetic flux. The apparatus further comprises second means for channeling magnetic flux comprising at least a first ferrite leg, a second ferrite leg, and a third ferrite leg, each physically separated from the first means for channeling magnetic flux by a first distance. The apparatus further comprises third means for channeling magnetic flux positioned between the second ferrite leg and the first means for channeling magnetic flux and physically contacting the second ferrite leg. The apparatus further comprises means for generating an alternating current under influence of an alternating magnetic field wound around the second ferrite leg.

In yet some other implementations, a method for manufacturing a double couple transformer configured to transmit charging power wirelessly to a vehicle is provided. The method comprises providing at least one ferrite structure comprising a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg. The method comprises winding a coil around the second ferrite leg such that the coil is configured to generate an alternating current under influence of an alternating magnetic field.

In some implementations, an apparatus configured to wirelessly transmit charging power to a load can include a power backbone and a power coil wound around a ferrite structure. The power backbone can be configured to generate a first alternating magnetic field, and the power coil can be configured to generate an alternating current via coupling with alternating magnetic field. The apparatus can further include a control coil wound around the ferrite structure and configured to reduce or prevent coupling of the power coil and the power backbone in a first configuration, and to allow coupling in a second configuration. In various embodiments the control coil includes a switch configured to selectively short-circuit or open-circuit the control coil to switch between the first and second configurations.

DETAILED DESCRIPTION

Figure 1:
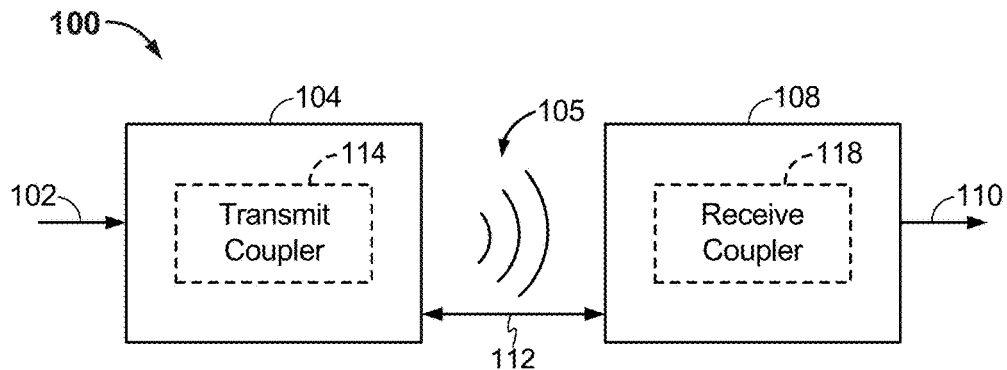
FIG. 1 is a functional block diagram of a wireless power transfer system, in accordance with an exemplary implementation.

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) may be received, captured, or coupled by a "receive coupler" to achieve power transfer.

The terminology used herein is for the purpose of describing particular implementations only and is not intended to be limiting on the disclosure. It will be understood that if a specific number of a claim element is intended, such intent will be explicitly recited in the claim, and in the absence of such recitation, no such intent is present. For example, as used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Wireless charging systems may use ferrite cores to concentrate and channel magnetic flux to both increase power transfer efficiency and to reduce unwanted electromagnetic emissions. However, certain designs for such ferrite cores result in poor magnetic performance, resulting in high currents that can lead to increased fringe magnetic flux along edges of the ferrite cores, can cause undesired heating of coil wires and can cause very high voltages that make the use of semiconductor switches in associated control systems impractical. Accordingly, methods and apparatuses for reducing flux cancellation in the ferrite of double couple inductive power transfer systems may be desirable.

FIG. 1 is a functional block diagram of a wireless power transfer system 100, in accordance with some implementations. Input power 102 may be provided to a transmitter 104 from a power source (not shown) to generate a wireless (e.g., magnetic or electromagnetic) field 105 via a transmit coupler 114 for performing energy transfer. The receiver 108 may receive power when the receiver 108 is located in the wireless field 105 produced by the transmitter 104. The wireless field 105 corresponds to a region where energy output by the transmitter 104 may be captured by the receiver 108. A receiver 108 may couple to the wireless field 105 and generate output power 110 for storing or consumption by a device (not shown in this figure) coupled to the output power 110. Both the transmitter 104 and the receiver 108 are separated by a distance 112.

In one example implementation, power is transferred inductively via a time-varying magnetic field generated by the transmit coupler 114. The transmitter 104 and the receiver 108 may further be configured according to a mutual resonant relationship. When the resonant frequency of the receiver 108 and the resonant frequency of the transmitter 104 are substantially the same or very close, transmission losses between the transmitter 104 and the receiver 108 are minimal. However, even when resonance between the transmitter 104 and receiver 108 are not matched, energy may be transferred, although the efficiency may be reduced. For example, the efficiency may be less when resonance is not matched. Transfer of energy occurs by coupling energy from the wireless field 105 of the transmit coupler 114 to the receive coupler 118, residing in the vicinity of the wireless field 105, rather than propagating the energy from the transmit coupler 114 into free space. Resonant inductive coupling techniques may thus allow for improved efficiency and power transfer over various distances and with a variety of inductive coupler configurations.

In some implementations, the wireless field 105 corresponds to the "near-field" of the transmitter 104. The near-field may correspond to a region in which there are strong reactive fields resulting from the currents and charges in the transmit coupler 114 that minimally radiate power away from the transmit coupler 114. The near-field may correspond to a region that is within about one wavelength (or a fraction thereof) of the transmit coupler 114. Efficient energy transfer may occur by coupling a large portion of the energy in the wireless field 105 to the receive coupler 118 rather than propagating most of the energy in an electromagnetic wave to the far field. When positioned within the wireless field 105, a "coupling mode" may be developed between the transmit coupler 114 and the receive coupler 118.

Figure 2:
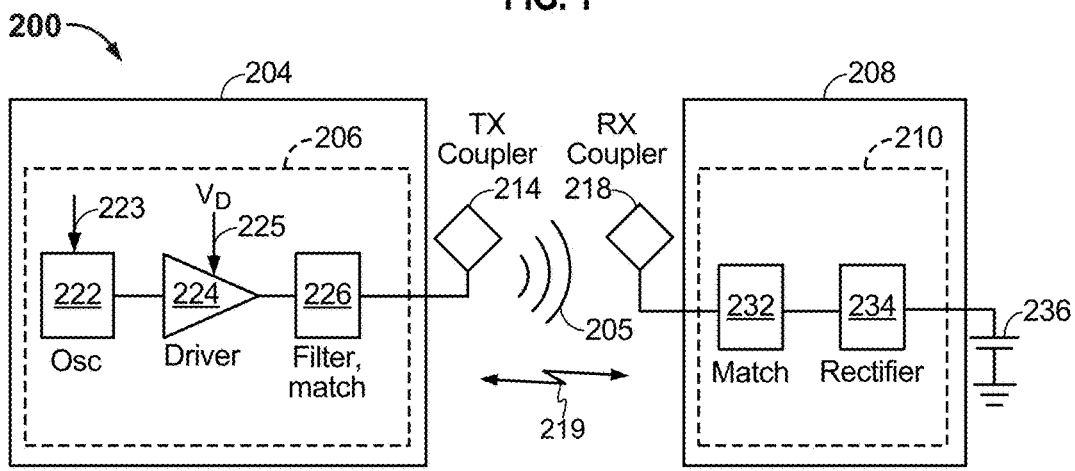
FIG. 2 is a functional block diagram of a wireless power transfer system, in accordance with another exemplary implementation.

FIG. 2 is a functional block diagram of a wireless power transfer system 200, in accordance with some other implementations. The system 200 may be a wireless power transfer system of similar operation and functionality as the system 100 of FIG. 1. However, the system 200 provides additional details regarding the components of the wireless power transfer system 200 as compared to FIG. 1. The system 200 includes a transmitter 204 and a receiver 208. The transmitter 204 includes transmit circuitry 206 that includes an oscillator 222, a driver circuit 224, and a filter and matching circuit 226. The oscillator 222 may be configured to generate a signal at a desired frequency that may be adjusted in response to a frequency control signal 223. The oscillator 222 provides the oscillator signal to the driver circuit 224. The driver circuit 224 may be configured to drive the transmit coupler 214 at a resonant frequency of the transmit coupler 214 based on an input voltage signal ($V_D$) 225.

The filter and matching circuit 226 filters out harmonics or other unwanted frequencies and matches the impedance of the transmit circuitry 206 to the transmit coupler 214. As a result of driving the transmit coupler 214, the transmit coupler 214 generates a wireless field 205 to wirelessly output power at a level sufficient for charging a battery 236.

The receiver 208 comprises receive circuitry 210 that includes a matching circuit 232 and a rectifier circuit 234. The matching circuit 232 may match the impedance of the receive circuitry 210 to the impedance of the receive coupler 218. The rectifier circuit 234 may generate a direct current (DC) power output from an alternate current (AC) power input to charge the battery 236. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205. In some implementations, the receiver 208 may be configured to determine whether an amount of power transmitted by the transmitter 204 and received by the receiver 208 is appropriate for charging the battery 236.

Figure 3:
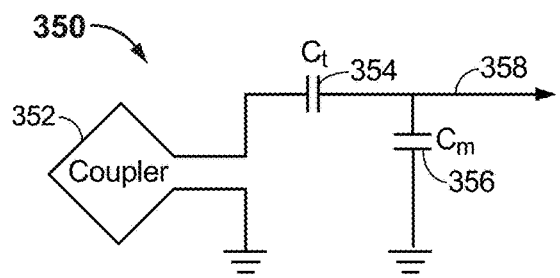
FIG. 3 is a schematic diagram of a portion of transmit circuitry or receive circuitry of FIG. 2 including a transmit or receive coupler, in accordance with an exemplary implementation.

FIG. 3 is a schematic diagram of a portion of the transmit circuitry 206 or the receive circuitry 210 of FIG. 2, in accordance with some implementations. As illustrated in FIG. 3, transmit or receive circuitry 350 may include a coupler 352. The coupler 352 may also be referred to or be configured as a "conductor loop", a coil, an inductor, or a "magnetic" coupler. The term "coupler" generally refers to a component that may wirelessly output or receive energy for coupling to another "coupler."

The resonant frequency of the loop or magnetic couplers is based on the inductance and capacitance of the loop or magnetic coupler. Inductance may be simply the inductance created by the coupler 352, whereas, capacitance may be added via a capacitor (or the self-capacitance of the coupler 352) to create a resonant structure at a desired resonant frequency, or at a fixed frequency set or prescribed by a particular operations standard. As a non-limiting example, a capacitor 354 and a capacitor 356 may be added to the transmit or receive circuitry 350 to create a resonant circuit configured to resonate at a resonant frequency. For larger sized couplers using large diameter couplers exhibiting larger inductance, the value of capacitance needed to produce resonance may be lower. Furthermore, as the size of the coupler increases, coupling efficiency may increase. This is mainly true if the size of both transmit and receive couplers increase. For transmit couplers, the signal 358, oscillating at a frequency that substantially corresponds to the resonant frequency of the coupler 352, may be an input to the coupler 352. For receive couplers, the signal 358 may be output and converted to power or charge a load. In some implementations, the frequency for inductive power transfer may be in the range of 20 kHz to 150 kHz.

In some wireless vehicle charging systems, the electric vehicle being charged is generally stationary, i.e., stopped near or above the base coupler such that the electric vehicle maintains presence within the wireless field generated by the base coupler. Thus, while the electric vehicle is being charged by such a wireless charging system, the electric vehicle may not be used for transportation.

In a dynamic roadway charging system, the electric vehicle may travel along a roadway and the dynamic wireless charging system may include a plurality of the base couplers placed linearly along a path of travel. The electric vehicle may request the dynamic wireless charging system activate the base couplers along the electric vehicle's path of travel. Such dynamic charging may also serve to reduce or eliminate the need for auxiliary or supplemental motor systems in addition to the electric locomotion system of the electric vehicle (e.g., a secondary gasoline engine of the hybrid/electric vehicle).

Figure 4:
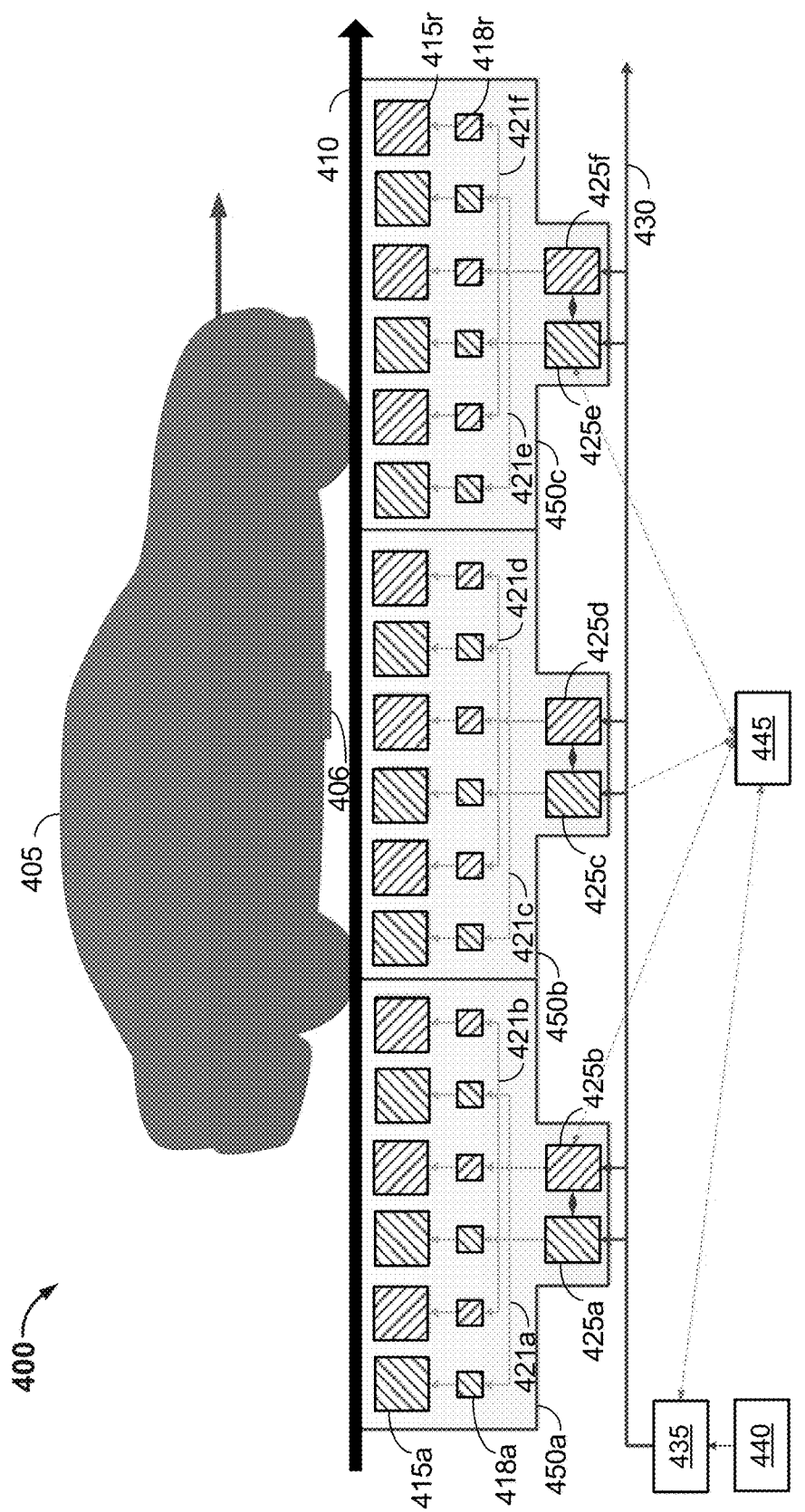
FIG. 4 illustrates a functional block diagram of an electric vehicle with at least one vehicle coupler in the presence of a wireless power transfer system, in accordance with an exemplary implementation.

FIG. 4 illustrates a functional block diagram of an electric vehicle 405 with at least one vehicle pad 406 in the presence of a wireless power transfer system 400, in accordance with an exemplary implementation. As shown in FIG. 4, various components of a distribution network of a wireless power transfer system 400 are installed beneath, along or beside a roadway 410. The roadway 410 extends from the left side to the right side of FIG. 4, with a direction of travel of the electric vehicle 405 aligned with the roadway 410. The electric vehicle 405 may comprise at least one vehicle pad 406, similar to the receivers 108/208, as previously described in connection with FIGS. 1 and 2, respectively. In some implementations, the at least one vehicle pad 406 may comprise a polarized coupling system (e.g., a double-D coupler), a quadrature coupler system, combined double-D quadrature coupler system (e.g., DDQ coupler), or any other system utilizing any other type or shape of coupler (e.g., circular, rectangular, or solenoid shaped couplers). A vehicle pad 406 (e.g., secondary coil) may couple with the magnetic field emitted by one of the primary coils to receive flux. In some implementations, the vehicle pad 406 (secondary coil) may be selected to compliment the primary coil(s) so as to couple with as much of the magnetic field to maximize the received flux. If the primary coil is producing polarized (e.g., horizontal) flux, then a polarized type of vehicle pad 406 may be used in the coupling system (e.g., a double-D coil or a solenoid) which may have better coupling with the flux output by the primary coil. Alternatively, if the primary coil is producing vertical flux, then a circular coil or a quadrature coil may be used (or in other words a coil that couples better to the vertical flux—e.g., more sensitive to inducing a larger voltage). The present application is not so limited, however. If the primary coil is producing a combination of horizontal and vertical flux, then a combination vehicle pad 406 may be used, e.g., a DDQ coil. The "double-D" may refer to placing two D-shaped coils back to back such that the overall shape of the coil is round. A quadrature coil may refer to a coil positioned to have minimal mutual coupling with the double-D coil arrangement and may have a different polarization type than the double-D coil.

The dynamic wireless charging system 400 may comprise a plurality of base couplers 415a-415r installed in, on, beside, or flush with the roadway 410. Each of the plurality of base couplers 415a-415r may be configured to generate a wireless field (see the wireless field 205 of FIG. 2) for wirelessly transferring power to the electric vehicle 405 via the at least one vehicle pad 406 when activated. In some implementations, each of a plurality of switches 418a-418r may be configured to operationally connect a respective one of the base couplers 415a-415r to one of a plurality of local controllers 425a-425f via one of a plurality of distribution circuits 421a-421f. In such implementations, the local controllers 425a-425f may be configured to wirelessly receive power from a power supply/inverter 435, via an alternating current (AC) power backbone 430, and control an amount of power transferred to one or more of the plurality of base couplers 415a-415r via the switches 418a-418r or by some other method. The power supply/inverter 435 may receive its power from a power source 440. The power source 440 and/or the power supply/inverter 435 may be sized based on a number of base couplers 415 to power, a number of local controllers 425, and/or a number and type of electric vehicles 405 to be charged. The power source 440 and power supply/inverter 435 may provide current alternating at a frequency utilized by the base couplers 415 or, alternatively, at some higher or lower frequency. The AC power backbone 430 may comprise a loop conductor that distributes the power and may be capable of synchronizing the base couplers 415 and/or the local controllers 425 that are near each other to a single phase. Thus, the AC power backbone 430 may be considered a phase reference that also distributes power.

A distribution controller 445 may be in communication with the power supply/inverter 435 and the local controllers 425a-425f and may be configured to provide global coordination of power control between the local controllers 425a-425f. Groups of the base couplers 415, the switches 418, and the local controllers 425 may comprise a series of individual base array network (BAN) modules 450a-450c. The respective components of the BAN modules 450 are shaded to indicate respective example common current paths. The division between the BAN modules 450 are shown to provide an example of how components may be manufactured in separate blocks/modules to facilitate easier installation into a roadway environment.

As the electric vehicle 405 travels along the roadway 410, the distribution controller 445 may communicate with one or more of the electric vehicle 405, the power supply/inverter 435, and the local controllers 425a-425f to coordinate activation or deactivation of particular ones of the base couplers 415a-415r. For example, the distribution controller 445 may command the power supply/inverter 435 to generate a current and distribute the current to the AC power backbone 430. The AC power backbone 430 may utilize the distributed current to wirelessly supply power to the local controllers 425a-425f via a "double couple transformer", the function of which will be described in more detail in connection with FIGS. 5 through 16 below.

The local controllers 425a-425f may receive the power from the AC power backbone 430 and provide a regulated amount of current to one or more of the base couplers 415a-415r. In some implementations, the local controllers 425 in each BAN module 450 may comprise individual control units capable of independent control from each other. Alternatively, the local controllers 425 of each BAN module 450 may comprise a single, shared control unit or processor. The base couplers 415a-415r may generate wireless fields according to the current received via the respective switch 418a-418r from the local controller 425a-425f and may couple to the at least one vehicle pad 406 to wirelessly transfer power to the electric vehicle 405.

Depending on the particular implementation, control of activation of the base couplers 415 may be shared to differing degrees between the distribution controller 445 and the local controllers 425a-425f. For example, in some implementations, the distribution controller 445 may coordinate the activation and deactivation of the base couplers 415a-415r and may coordinate any communications or actions between multiple BAN modules 450a-450c. In some other implementations, the distribution controller 445 may simply coordinate communications between the BAN modules 450a-450c or local controllers 425a-425f, while the local controllers 425a-425f may control the base coupler sequencing. In yet other implementations, the distribution controller 445 may activate a particular BAN module 450a-450c, but leave timing of the base coupler activations to the associate local controller(s) 425a-425f. In yet other implementations, the distribution controller 445 may communicate only non-critical information to the local controllers 425a-425f and not provide base coupler activation information.

Higher level coordination by the distribution controller 445, combined with the more localized current distribution and regulation at the local controllers 425a-425f may create a more responsive dynamic wireless charging system 400 with decentralized control via the local controllers 425a-425f. This may allow the local controllers 425a-425f to control current flow independently of the distribution controller 445 and allow local control of impedance matching and reactive voltage/amperage (VAr) loading. Such localized control may provide a decreased VAr load compensation response time since instructions need only come from the local controller 425a-425f and not from the distribution controller 445.

The distribution controller 445 may also obtain information regarding the velocity and position of the electric vehicle 405 for controlling activation of particular ones of the base couplers 415a-415r. The distribution controller 445 may obtain this information from the electric vehicle 405 or from various sensors or load analysis of the base couplers 415a-415r. In other implementations, each of the BAN modules 450a-450c may sense the presence of the electric vehicle 405 and autonomously and selectively activate the appropriate base couplers 415a-415r according to a detected presence or location of the electric vehicle 405. In yet other implementations, the BAN modules 450a-450c may receive a signal comprising information regarding the electric vehicle 405 velocity and/or position or an activation command from a neighboring BAN module. The received signal may come directly from the neighboring BAN module (e.g., a corresponding local controller 425) or via the distribution controller 445.

When a respective local controller 425 receives a signal from the distribution controller 445 to activate a specific base coupler 415, the respective local controller 425 may activate the switch 418 corresponding to the specific base coupler 415. As the vehicle 405 continues in the direction of travel, the local controllers 425a-425f may receive commands from the distribution controller 445 to activate or deactivate specific base couplers 415a-415r based on the position of the vehicle pad 406. The local controllers 425a-425f may further control or regulate the current from the AC power backbone 430.

As depicted, the base couplers 415 from consecutive local controllers 425 may be interleaved or interlaced such that a single local controller 425 may provide power to alternating base couplers 415. Thus, the base couplers 415 from a first local controller 425 may be proximally interleaved with the base couplers 415 controlled by a second local controller 425 when the two local controllers 425 are within the same BAN 450. Thus, alternating base couplers 415 may be powered by different local controllers 425 and one local controller need not simultaneously power two adjacent base couplers 415. Additionally, preventing a single local controller 425 from providing current to consecutive or adjacent base couplers 415 may reduce power rating requirements of individual components, as each component need only be capable of handling the current load of a single base coupler 415 at a given time.

Figure 5:
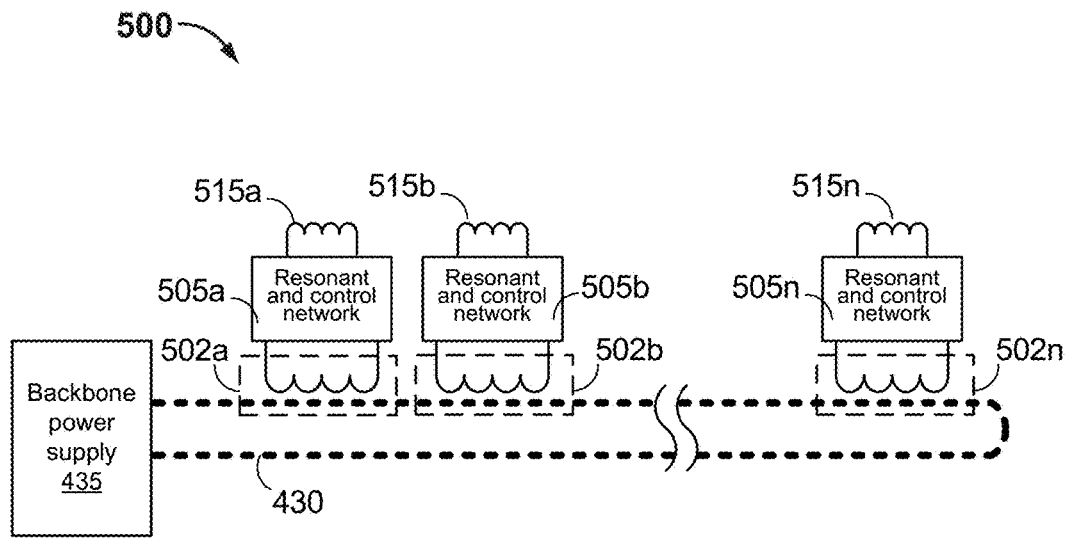
FIG. 5 depicts another block diagram of a wireless power transfer system corresponding to the wireless power transfer system of FIG. 4.

FIG. 5 depicts another block diagram of a wireless power transfer system 500 corresponding to the wireless power transfer system 400 of FIG. 4. As shown in FIG. 5, the wireless power transfer system 500 comprises the power supply 435 of FIG. 4 electrically connected to the AC power backbone 430 of FIG. 4. The system 500 additionally includes a plurality of resonant and control networks ("network") 505a-505n each connected to a respective one of a plurality of double couple transformers 502a-502n and to one or more base couplers 515a-515n. In some implementations, the networks 505a-505n may correspond to networks comprising one or more of the local controllers 425, the distribution circuits 421 and the switches 418, as previously described in connection with FIG. 4. Accordingly, the networks 505a-505n may complete the switching functions of the switches 418 and may provide current for the proper functioning of the base couplers 515a-515n. The base couplers 515a-515n may correspond to the base couplers 415, as previously described in connection with FIG. 4. However, each of the base couplers 515a-515n may also be representative of multiple ones of the base couplers 415a-415r. Although three (3) networks 505a-505n are shown, any number of networks may be utilized according to a particular implementation.

In a roadway application, such as that shown in FIG. 4, a number of double couple transformers 502a-502n may be implemented to transfer power from the AC power backbone 430 to each of the base couplers 515a-515n. "Double couple," as used herein, generally relates to the notion that there are two wireless couplings associated with each double couple transformer: a first coupling between the backbone 430 and the double couple transformer 502a-502n and a second coupling between the base couplers 515a-515n and the vehicle pad 406 (see FIG. 4). The double couple transformers 502a-502n may each comprise at least one coil (e.g., a coupler or a transformer) configured to wirelessly couple with the AC power backbone 430 and receive wireless power. The double couple transformers 502a-502n may then supply current and power via the respective network 505a-505n to the base coupler(s) 515a-515n. The double couple transformers 502a-502n are depicted as operationally coupled to a single base coupler 515 for simplicity. However, each of the BANs 450a-450c as previously described in connection with FIG. 4 may comprise two or more double couple transformers, for example, providing power to each of three of the base couplers 415. Each double couple transformer 502a-502n may comprise a series of windings on or around a core comprising ferromagnetic materials (e.g., ferrite), as will be described in more detail in connection with FIGS. 6-14 below. The double couple transformers 502a-502n may operate similar to a transformer, receiving wireless power from the AC power backbone 430 via a wireless field (see the wireless field 205 of FIG. 2). The wireless power received at the double couple transformer 502a-502n may then be transferred through the respective network 505a-505n and ultimately to the base couplers 515a-515n.

The base couplers 515a-515n may be controlled (e.g., activated and deactivated) via commands from the networks 505a-505n, in a manner similar to that utilized by the local controllers 425a-425f to control the base couplers 415a-415r, as previously described in connection with FIG. 4.

Figure 6:
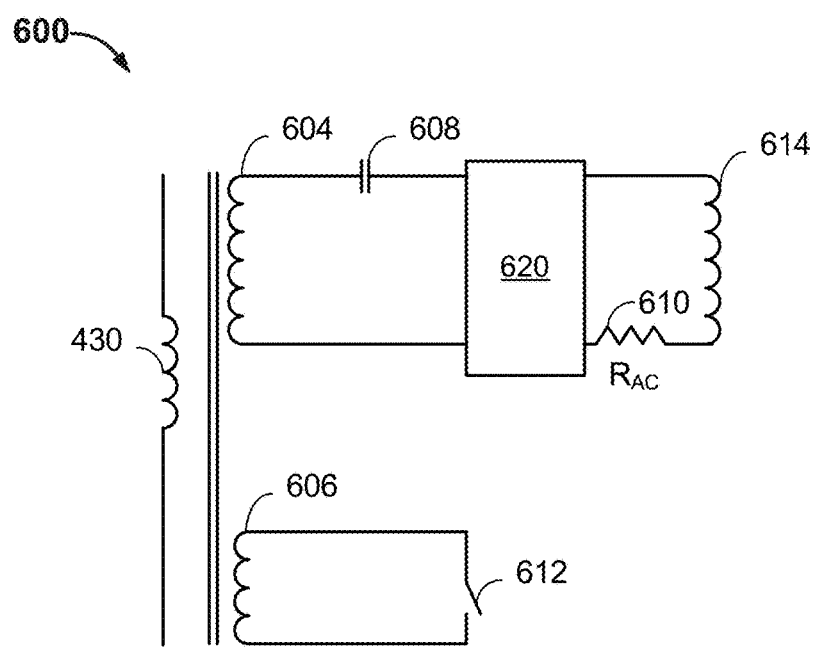
FIG. 6 illustrates a double couple transformer, in accordance with some implementations.

FIG. 6 illustrates a double couple transformer 600, in accordance with some implementations. The double couple transformer 600 comprises a first coil 604 and a control coil 606, each a part of a larger circuit and both wound around a common ferromagnetic core (not shown). In some implementations, the first coil 604 is connected to a resonant capacitor 608 tuned to resonate with the first coil 604 at a desired resonant frequency. The first coil 604 and the resonant capacitor 608 are connected to a tuning circuit 620, which may function to increase an amount of current at an output of the tuning circuit compared to the input of the tuning circuit. The output of the tuning circuit 620 may be connected across a load, shown as a second coil 614 connected in series with a resistance $R_{AC}$, which collectively may represent a base array network (BAN), such as the Base Array Network (BAN) modules 450a-450c of FIG. 4.

In some implementations, the first coil 604 may operate at voltages approaching or exceeding 2 kV, which may include higher voltage semiconductors and may be expensive. An alternating current is driven though the AC power backbone 430 to generate a first alternating magnetic field (not shown). When the switch 612 in the control coil circuit is open-circuited, the alternating magnetic field induces an alternating current in the first coil 604 at the desired resonant frequency, which may be utilized to wirelessly transmit power via a second alternating magnetic field generated by driving the second coil 614 (e.g., the BAN modules 450a-450c). When power is to be interrupted from the first coil 604, the switch 612 is closed. Since the first coil 604 and the control coil 606 are wound around a common ferromagnetic core, closing the switch 612 completes the control circuit. The current flowing in the control circuit then creates a magnetic flux that opposes and substantially cancels out the magnetic flux caused by the AC power backbone 430. Thus, when the switch 612 is closed little magnetic flux passes through the core, stopping power transfer to the first coil 604. Closing the switch 612 has the added advantage of reducing the primary inductance of the combination of the first coil 604 and the control coil 606, which is highly desirable where a plurality of double couple transformers are located on each AC power backbone (e.g., 14 transformers on an example 25 m power backbone). Moreover, closing the switch 612 has the added advantage of reducing the inductance of the AC power backbone 430. This is accomplished as a result of the induced current in the control coil 606 cancelling out flux produced by that section of the AC power backbone 430. This allows a plurality of the double couple transformers 600 to be utilized on the same AC power backbone 430. A lower AC power backbone 430 inductance enables a longer length of AC power backbone 430 to be driven by the same voltage, thus lowering system cost. Closing the control coil 606 also reduces the inductance of the first coil 604.

In one embodiment, an apparatus configured to wirelessly transmit charging power to a vehicle load can include the control coil 606. For example, that apparatus can include a power backbone (for example, the AC power backbone 430) and a power coil (for example, the coil 604) wound around a ferrite structure. The power backbone can be configured to generate a first alternating magnetic field, and the power coil can be configured to generate an alternating current via coupling with alternating magnetic field. The apparatus can further include a control coil (for example, the control coil 606) wound around the ferrite structure and configured to reduce or prevent coupling of the power coil and the power backbone when selectively activated (e.g., when in a first configuration). For example, the control coil may be activated by being put into a short-circuit configuration (e.g., switch 612 of FIG. 6 is closed). When the control coil is inactive (e.g., in a second configuration, such as, for example, when switch 612 is open), coupling between the AC power backbone and power coil is allowed. In various embodiments the control coil includes a switch configured to selectively short-circuit or open-circuit the control coil.

Figure 7:
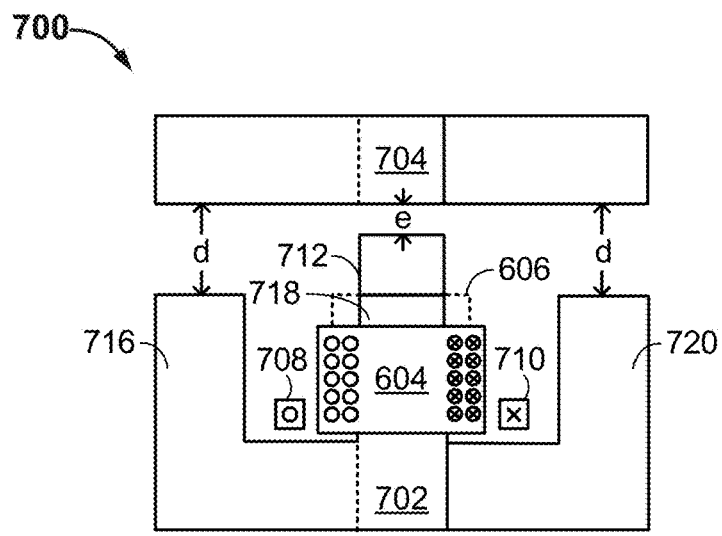
FIG. 7 illustrates a side view of a ferrite structure used in a double couple transformer, in accordance with some implementations.

FIG. 7 illustrates a side view of a ferrite structure 700 used in a double couple transformer, in accordance with some implementations. The ferrite structure 700 includes a first ferrite portion 704, which may comprise an "I" (e.g., substantially rectangular) shaped ferrite tile. In some implementations, the first ferrite portion 704 comprises 2 or more I shaped tiles, as shown by the solid and dotted lines in the first ferrite portion 704. In some implementations, the overlapping portions of the 2 or more I shaped tiles may be in direct physical contact with one another in order to provide an uninterrupted, low reluctance path within which magnetic flux may flow. The ferrite structure 700 also includes a second ferrite portion 702 separated from the first ferrite portion 704 by a first distance "d", which may comprise a substantially "E" shaped ferrite tile. In some implementations, as will be shown in connection with FIG. 8, the second ferrite portion 702 may comprise two substantially "U" shaped ferrite tiles having opposite legs that are aligned and overlap and extend in substantially the same direction to form a substantially "E" shape. As shown in FIG. 7, the second ferrite portion 702 includes a first ferrite leg 716, a second ferrite leg 718, and a third ferrite leg 720. In some implementations, the first, second and third ferrite legs may be parallel to one another. In some implementations, the first, second and third ferrite legs may be physically connected to one another by another ferrite leg or portion having an orientation perpendicular to each of the first, second and third ferrite legs. In some implementations, as shown in FIG. 7, the first ferrite leg 716, the second ferrite leg 718, and the third ferrite leg 720 as well as the perpendicular ferrite leg form the monolithic second ferrite portion 702. Where the second ferrite portion 702 comprises 2 or more "U" shaped ferrite tiles, the second ferrite leg 718 may comprise one leg of a first "U" shaped ferrite tile in direct physical contact with the opposite leg of a second "U" shaped ferrite tile. Here, the first ferrite leg 716 would be formed from the remaining leg of the first "U" shaped ferrite tile, while the third ferrite leg 720 would be formed from the remaining leg of the second "U" shaped ferrite tile.

A third ferrite portion 712 (e.g., a ferrite foot) may be positioned between the second ferrite leg 718 and the first ferrite portion 704, the third ferrite portion 712 physically contacting the second ferrite leg 718. In some implementations, the third ferrite portion 712 and the second ferrite leg 718 of the second ferrite portion 702 may be combined into a single structure (i.e., the second ferrite leg 718 has a greater length than the first ferrite leg 716 and the third ferrite leg 720). In such an implementation, the third ferrite portion 712 may not be present, but instead may be incorporated into the longer second ferrite portion 702.

A first air gap is shown between the first ferrite leg 716 and the first ferrite portion 704, a second air gap is shown between the third ferrite portion 712 (e.g., the ferrite foot) and the first ferrite portion 704, and a third air gap is shown between the third ferrite leg 720 and the first ferrite portion 704. The first air gap and the third air gap have a spacing of "d," while the second air gap has a spacing of "e." Thus, the second air gap is smaller than each of the first air gap and the third air gap. This is by virtue of the fact that the first ferrite portion 704 and the proximal edges of each of the first ferrite leg 716, the second ferrite leg 718, and the third ferrite leg 720 are separated by the first distance "d" and the third ferrite portion 712, physically contacting the second ferrite leg 718, reduces the second air gap by the length of the third ferrite portion 712 to "e." In some implementations, the first and third air gaps ("d") may be approximately 21 mm while the second air gap ("e") may be approximately 5 mm. Though the present application is not so limited and any gaps lengths "d" and "e" may be utilized, including but not limited to different lengths for each of the first, second and third air gaps.

FIG. 7 also illustrates the first coil 604 wound around the second ferrite leg 718. The first coil 604 may be configured to generate an alternating current under influence of an alternating magnetic field generated by at least one of a first conductor 708 of the alternating current power backbone 430 disposed in a first space between the first ferrite leg 716 and the second ferrite leg 718, and a second conductor 710 of the alternating current power backbone 430 disposed in a second space between the second ferrite leg 718 and the third ferrite leg 720. Since the AC power backbone 430 comprises a long loop conductor, the current flowing through the first conductor 708 may have substantially opposite polarity and substantially same magnitude of current flowing through the second conductor 710. FIG. 7 also optionally includes the control coil 606 wound around the second ferrite leg 718 and configured to function as previously described in connection with FIG. 6.

The implementation shown in FIG. 7 is more efficient, more cost effective, easier to install and remove for maintenance, and easier to manufacture than implementations without the third ferrite portion 712 (e.g., the ferrite foot) since the difference in length of the second air gap compared to the first and third air gaps makes this implementation less sensitive to minor misalignments of the first ferrite portion 704 from the second ferrite portion 702.

Figure 8:
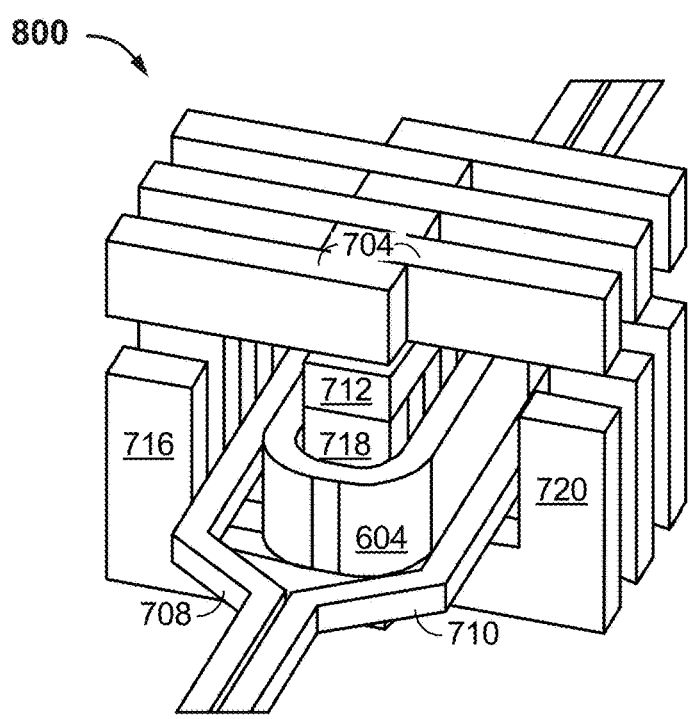
FIG. 8 illustrates an isometric view of the ferrite structure of FIG. 7.

FIG. 8 illustrates an isometric view 800 of the ferrite structure 700 of FIG. 7. As shown, in some implementations, the ferrite structure may comprise a plurality of the ferrite structures 700 of FIG. 7, each substantially the same as the at least one ferrite structure. In addition, the first ferrite portion 704 is shown, in some implementations, to comprise a plurality of interleaved "I" shaped ferrite tiles, each disposed substantially coplanar with a respective one of a plurality of interleaved "U" shaped ferrite tiles that form the second ferrite portion 702. In some implementations, each "I" shaped ferrite tile may be in direct physical contact with adjacent "I" shaped ferrite tiles at the interleaved portions. Likewise, in such implementations, each "U" shaped ferrite tile may be in direct physical contact with adjacent "U" shaped ferrite tiles at the interleaved portions. However, ferrite tiles may not be perfectly flat and pressing them together may cause cracking. Thus, in some other implementations, a rubbery or otherwise flexible material may be disposed between adjacent interleaved "I" shaped tiles and/or between adjacent interleaved "U" shaped (or "E" shaped) tiles. Such in addition to preventing ferrite cracking, use of such rubbery or otherwise flexible material may be another dimension by which reluctance of magnetic flux paths may be manipulated or adjusted since the material may introduce additional higher reluctance gaps between the ferrite portions of the paths.

FIG. 8 further illustrates that the third ferrite portion 712 (e.g., the ferrite foot) may comprise an "I" shaped ferrite tile extending in a direction normal to the plane (e.g., perpendicular to the tangent plane) of each "U" or "E" shaped ferrite tile and directly physically contacting the second ferrite portion 702 at one end of each second ferrite leg 718. The third ferrite portion 712 may comprise a single "I" shaped ferrite tile that extends along and directly physically contacts each second ferrite leg 718, or may alternatively comprise a plurality of "I" shaped ferrite tiles that each extend along and directly physically contact one or more adjacent second ferrite legs 718. Where the third ferrite portion 712 comprises a plurality of "I" shaped ferrite tiles, each ferrite tile may or may not directly physically contact the adjacent ferrite tile. Where the ferrite tiles do not directly physically contact adjacent ferrite tiles, the reluctance of magnetic flux paths between adjacent ferrite tiles will be increased due to the higher reluctance air or material gaps between the ferrite tiles. Moreover, as shown, the first coil 604 may be wound around the second ferrite leg of the ferrite structure 700 and around a second ferrite leg of at least one other ferrite structure 700 substantially the same as the ferrite structure 700.

Figure 9:
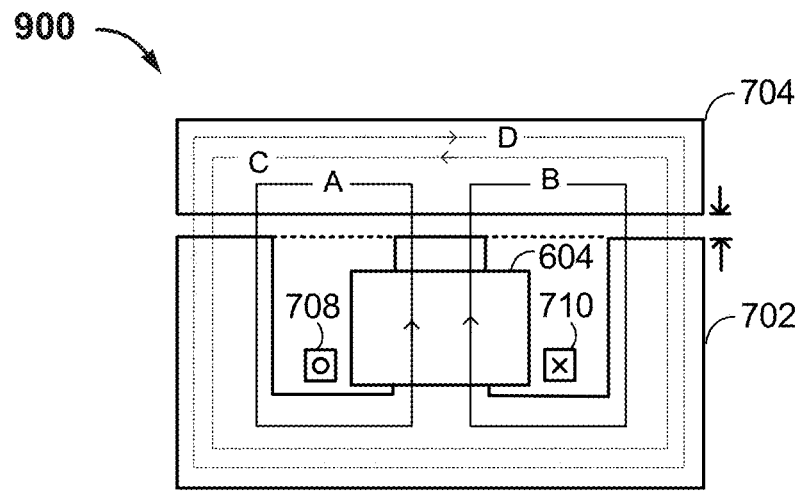
FIG. 9 illustrates a side view of a ferrite structure that does not include a ferrite foot, in accordance with some implementations.
Figure 10:
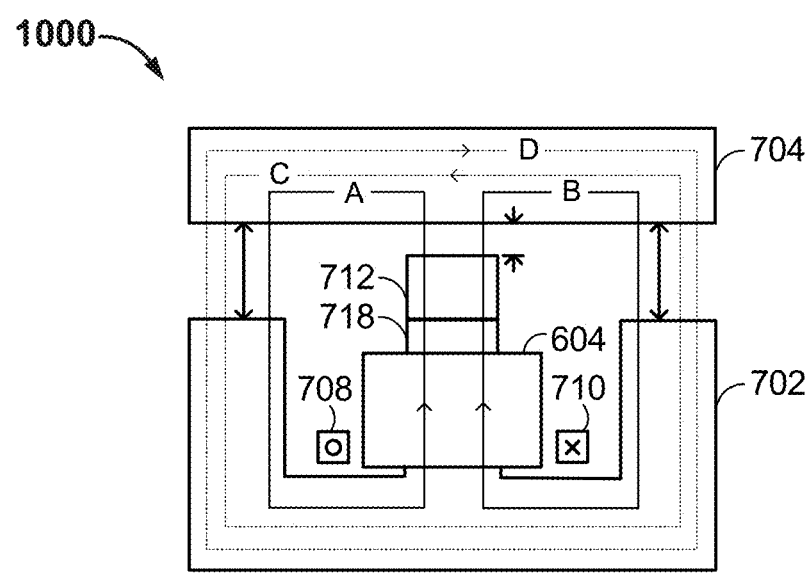
FIG. 10 illustrates a side view of a ferrite structure that does include a ferrite foot, in accordance with some implementations.

To more clearly illustrate one advantage to utilizing the third ferrite portion (e.g., the ferrite foot) implementations, FIGS. 9 and 10 show several reluctance paths through the ferrite structure with and without the ferrite foot.

FIG. 9 illustrates a side view of a ferrite structure 900 that does not include a ferrite foot, in accordance with some implementations. The ferrite structure 900 includes the first ferrite portion 704 and the second ferrite portion 702 comprising the first ferrite leg 716, the second ferrite leg 718, and the third ferrite leg 720, each physically separated from the first ferrite portion by a particular distance. This distance is generally less than the first distance previously described in connection with FIG. 7, for example, 6 mm. The first conductor 708 and the second conductor 710 of the AC power backbone 430 are also shown. The "O" indicates instantaneous current flowing out of the page, while the "X" indicates instantaneous current flowing into the page.

As current flows through the first conductor 708 an alternating magnetic field induces magnetic flux in a first direction (shown as counter-clockwise) in a first reluctance path "A" and in a first direction (shown as counter-clockwise) in a third reluctance path "C." Similarly, as current flows through the second conductor 710 an alternating magnetic field induces a magnetic flux in a second direction (shown as clockwise) in a second reluctance path "B" and in a second direction (shown as clockwise) in the third reluctance path "D." As shown in FIG. 9, and with reference to claim 3, the first reluctance path passes through, in order, the first ferrite portion 704, the first air gap, the second ferrite portion 702 (specifically through the first ferrite leg 716 and the second ferrite leg 718), and the second air gap to complete a closed circuit. The second reluctance path passes through, in order, the first ferrite portion 704, the second air gap, the second ferrite portion (specifically through the second ferrite leg 718 and the third ferrite leg 720), and the third air gap to complete a closed circuit. The third reluctance path passes through, in order for "C" or in reverse order for "D", the first ferrite portion 704, the first air gap, the second ferrite portion 702 (specifically through the first ferrite leg 716 and the third ferrite leg 720), and the third air gap. The magnetic reluctance of a particular path may be calculated according to equation (1) below:

$$R = l/(N(\mu_0 \mu_r A)) \quad \text{(Eq. 1)}$$

where R is the reluctance in inverse Henries ($H^{-1}$), l is the length of the path in meters, $\mu_0$ is the permeability of vacuum, $\mu_r$ is the relative magnetic permeability of the material and A is the cross-sectional area of the circuit in square meters.

The reluctance paths "A" and "B" are desired paths for magnetic flux to flow as they increase coupling between the first conductor 708 and the first coil 604 and/or the control coil 606 (see FIG. 6) and between the second conductor 710 of the AC power backbone 430 and the first coil 604 and/or the control coil 606 (see FIG. 6). Paths "C" and "D" are undesired paths for magnetic flux to flow as they decrease coupling between the first conductor 708 and the second conductor 710 of the AC power backbone 430 and the first coil 604 and/or the control coil 606 (see FIG. 6). Because the desired paths "A" and "B" flow through air gaps that have substantially the same length as the undesired paths "C" and "D," the magnetic reluctance of paths "A," "B," "C," and "D" are similar. This means magnetic flux flowing through the undesired paths "C" and "D" is relatively high compared to magnetic flux flowing through the desired paths "A" and "B," causing significant magnetic flux cancellation and significantly reduced coupling between the first conductor 708 and the second conductor 710 of the AC power backbone 430 and the first coil 604.

FIG. 10 illustrates a side view of a ferrite structure 1000 that includes a ferrite foot, in accordance with some implementations. The ferrite structure 1000 includes the first ferrite portion 704, the second ferrite portion 702 comprising the first ferrite leg 716, the second ferrite leg 718, and the third ferrite leg 720, each physically separated from the first ferrite portion 704 by the first distance previously described in connection with FIG. 7, and also the third ferrite portion 712 positioned between the second ferrite leg 718 and the first ferrite portion 704 and physically contacting the second ferrite leg 718. The first conductor 708 and the second conductor 710 of the AC power backbone 430 are also shown. The "O" indicates instantaneous current flowing out of the page, while the "X" indicates instantaneous current flowing into the page. However, current flows in both directions in each of the first conductor 708 and the second conductor 710, though opposite directions at any particular instant. As shown, the third ferrite portion 712 (e.g., the ferrite foot) effectively increases the length of the second ferrite leg 718, allowing an increase in the length of the first air gap and the third air gap between the first ferrite portion 704 and the first ferrite leg 716 and third ferrite leg 720, respectively, while reducing the length of the second air gap between the first ferrite portion 704 and the third ferrite portion 712.

As current flows through the first conductor 708 and through the second conductor 710 an alternating magnetic field induces a magnetic flux in a first direction (shown as counter-clockwise) in the first reluctance path "A" and in the first direction (shown as counterclockwise) in the third reluctance path "C." Similarly, as current flows through the first conductor 708 and through the second conductor 710 the alternating magnetic field induces a magnetic flux in the second direction (shown as clockwise) in the second reluctance path "B" and in the second direction (shown as clockwise) in the third reluctance path "D." As described in FIG. 9, the first reluctance path passes through, in order, the first ferrite portion 704, the first air gap, the second ferrite portion 702 (specifically through the first ferrite leg 716 and the second ferrite leg 718), the third ferrite portion 712 and the second air gap to complete a closed circuit. The second reluctance path passes through, in order, the first ferrite portion 704, the third air gap, the second ferrite portion (specifically through the third ferrite leg 720 and the second ferrite leg 718), the third ferrite portion 712 and the second air gap to complete a closed circuit. The third reluctance path passes through, in order for "C" or in reverse order for "D", the first ferrite portion 704, the first air gap, the second ferrite portion 702 (specifically through the first ferrite leg 716 and the third ferrite leg 720), and the third air gap. Since the relative permeability of air is several orders of magnitude lower than ferrite, the undesired paths "C" and "D" pass through two increased length air gaps, increasing the magnetic reluctance to a much greater extent compared to the desired paths "A" and "B," for which only one air gap length is increased, compared to the implementation shown in FIG. 9. Thus, the third reluctance path "C" or "D" passing through the first air gap and the third air gap provides a higher magnetic reluctance compared to either the first reluctance path "A" and the second reluctance path "B". This results in a first magnetic flux flowing in the third reluctance path "C" or "D" that is less than a second magnetic flux flowing in the first reluctance path "A" and less than a third magnetic flux flowing in the second reluctance path "B" and, thus, reduced cancellation compared to the implementation in FIG. 9. Accordingly, utilizing the third ferrite portion 712 (e.g., the ferrite foot) prevents or substantially reduces undesired magnetic flux cancellation and increases coupling between the AC power backbone 430 and the first coil 604.

Figure 11:
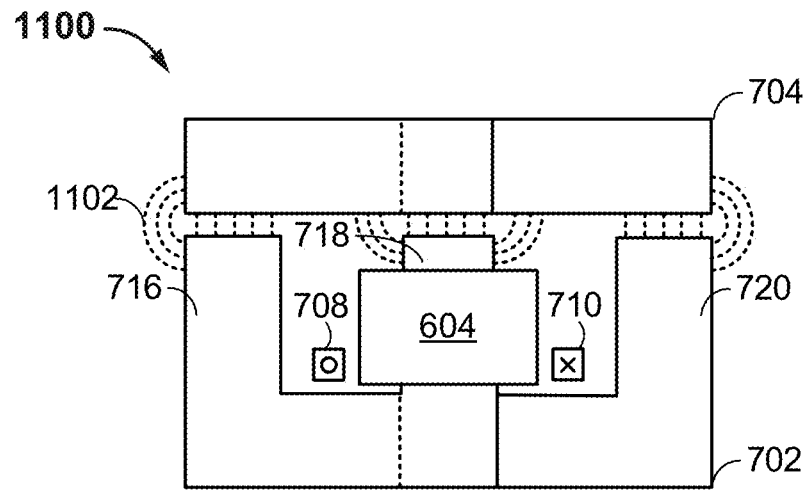
FIG. 11 shows fringe magnetic flux for a ferrite structure without the third ferrite portion (e.g., ferrite foot), in accordance with some implementations.

FIG. 11 shows fringe magnetic flux for a ferrite structure 1100 without the third ferrite portion (e.g., ferrite foot), in accordance with some implementations. As shown in FIG. 11, magnetic flux has to cross the first, second and third air gaps. Because of the relatively low reluctance path, there is a large amount of fringing magnetic flux 1102 that appears at the air gaps. Such high magnetic flux densities, especially in and around the second ferrite leg 718 induce excessive current and cause excessive heating in the first coil 604, which reduces system efficiency. In such implementations, the first coil 604 may have to be positioned lower on the second ferrite leg 718 such that the first coil 604 does not intersect this volume of high fringing magnetic flux.

Figure 12:
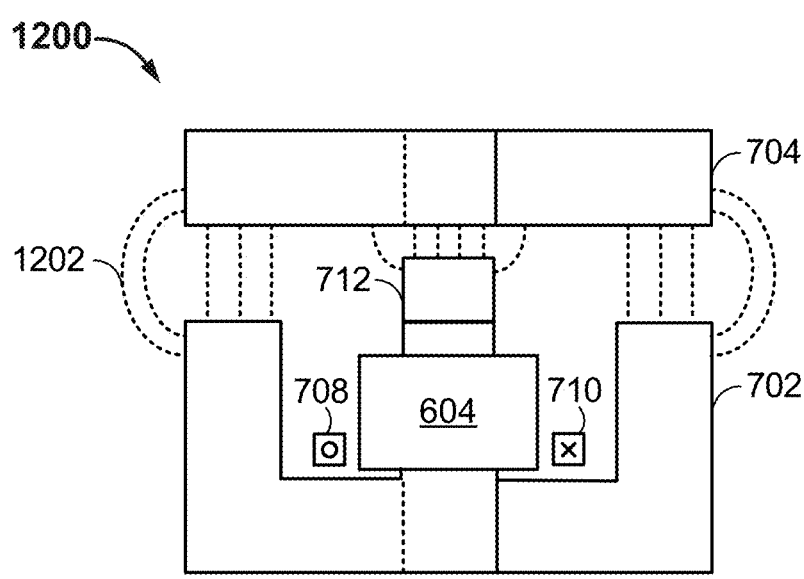
FIG. 12 shows fringe magnetic flux for a ferrite structure the third ferrite portion (e.g., ferrite foot), in accordance with some implementations.

FIG. 12 shows fringe magnetic flux for a ferrite structure 1200 the third ferrite portion 712 (e.g., ferrite foot), in accordance with some implementations. As shown in FIG. 12, magnetic flux still has to cross the first, second and third air gaps. However, due to the increased magnetic reluctance of the paths previously described in connection with FIG. 10, there is a reduced amount of fringing magnetic flux 1202 that appears at the air gaps, especially in and around the second ferrite leg 718. This reduces the magnetic flux density above the first coil 604 and reduces the heating effect in the ferrite as well as in the first coil 604. Since the use of the third ferrite portion 712 reduces the fringing magnetic flux at the second air gap above the second ferrite leg 718, a wider (e.g., taller) first coil 604 extending closer to the second air gap can be used since a volume of excessive fringing magnetic flux is not present near the top of the second ferrite leg 718. This may result in easier packaging and/or more desirable voltage or current profiles in the first coil 604.

Figure 13:
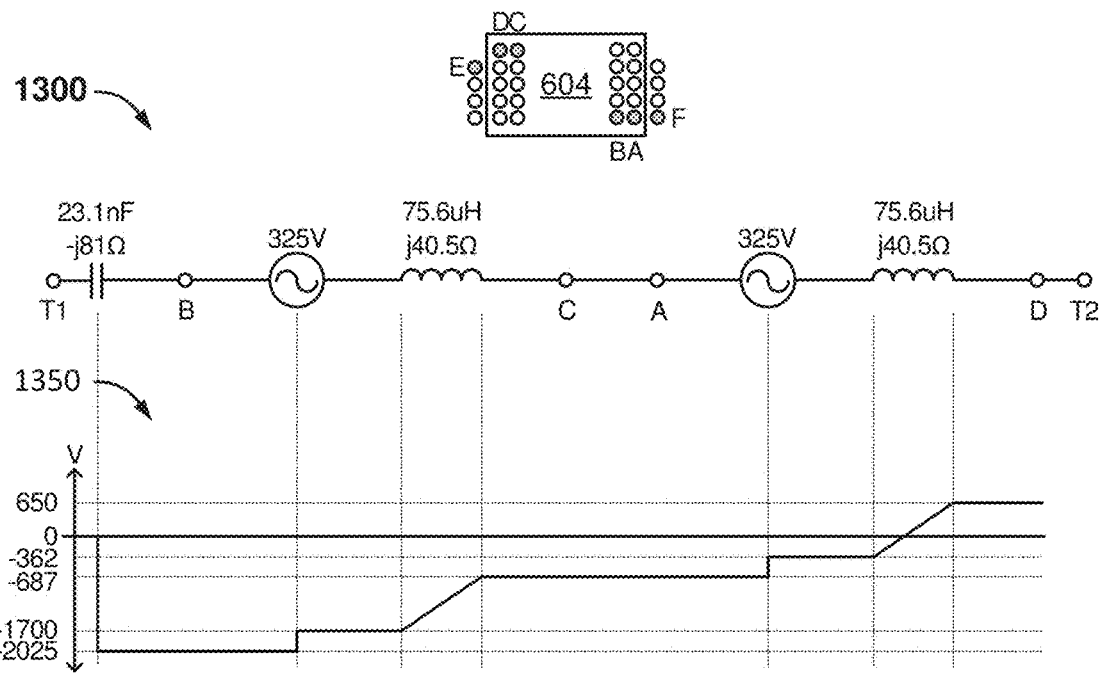
FIG. 13 illustrates an equivalent circuit diagram and voltage plot associated with the power coil previously described in connection with FIGS. 6-12, in accordance with some implementations.

FIG. 13 illustrates an equivalent circuit diagram 1300 and voltage plot 1350 associated with the first coil 604 previously described in connection with FIGS. 6-12, in accordance with some implementations. Certain non-limiting values for certain components are shown for purposes of illustration only. The values may vary according to the particular application. As shown, the first coil 604 is shown as being wound in two layers, the circles indicating particular cross sections of the conductor. The first layer begins at B and winds up to C. The second layer is directly connected to the first layer and begins at A and winds up to D. Also shown is the control coil 606 wound around the first coil 604 in a single layer beginning at F and ending at E or vice versa. Although a particular number of layers and windings are shown, they are non-limiting examples and any number of windings and layers are contemplated. The diagram 1300 shows a series circuit including, in order, a first terminal T1, the resonance capacitor 608 previously described in FIG. 6, a first equivalent voltage source of 325V and a first inductance together corresponding to the first layer of windings of the first coil 604 between B and C, a second equivalent voltage source of 325V and a second inductance together corresponding to the second layer of windings of the first coil 604 between A and D, and a second terminal T2.

As shown in the voltage plot 1350 at T1 the voltage is 0V and drops to −2025V at the other side of the resonance capacitor 608 at B. The voltage then rises by 325V to −1700V at the first equivalent voltage source and then rises from −1700V to −687V across the first equivalent inductance of the first winding between B and C. In the second winding between A and D, the voltage rises again from −687V to −362V at the second equivalent voltage source and then rises from −362V to 650V across the second equivalent inductance of the second winding between A and D. In this implementation the resonant current is assumed to be 25 A at 85 kHz and in phase with $V_{oc}$. Due to series tuning, although $V_{oc}$ across the terminals of the resonant transformer is measured at 650V, the voltage across the first and second layers of the first coil 604 is 1.3 kV. This is sufficiently high that insulation may be required between the first and second layers of windings, creating undesirably high voltage stresses and potentially a corona across the first coil 604 due to the maximal voltage difference between the first and last turns, which creates losses in the first coil 604.

Figure 14:
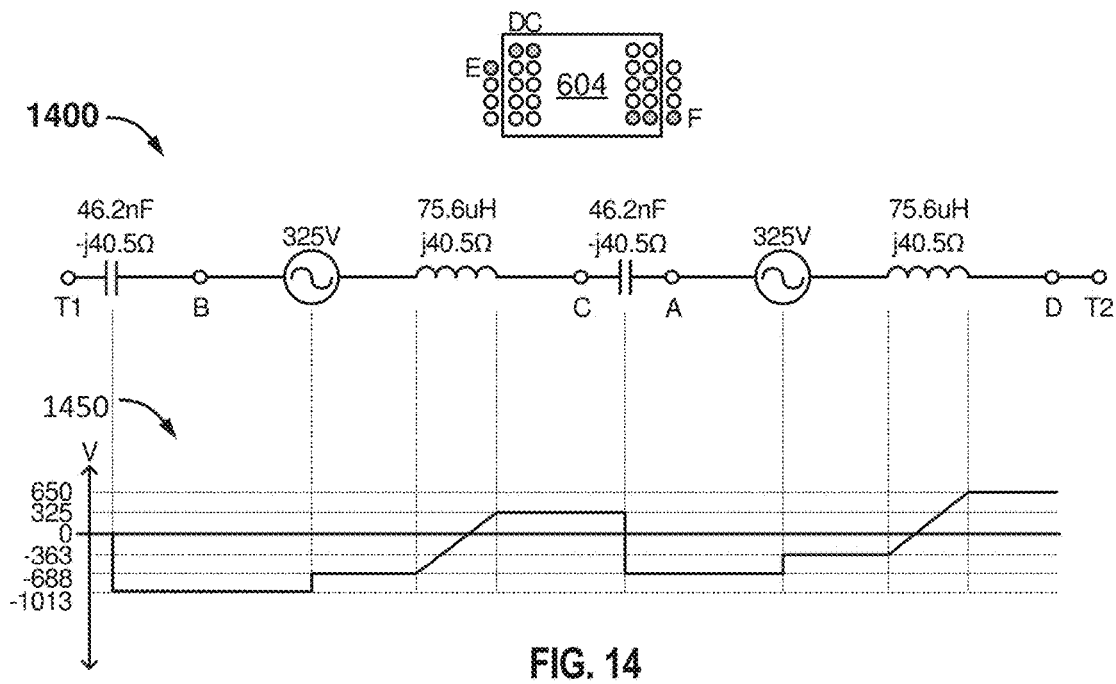
FIG. 14 illustrates an equivalent circuit diagram and voltage plot associated with the power coil previously described in connection with FIGS. 6-12, in accordance with some implementations.

FIG. 14 illustrates an equivalent circuit diagram 1400 and voltage plot 1450 associated with the first coil 604 previously described in connection with FIGS. 6-12, in accordance with some implementations. As shown, the first coil 604 is shown as being wound in two layers, the circles indicating particular cross sections of the conductor. The first layer begins at B and winds up to C. Contrary to FIG. 13, in FIG. 14, the second layer is connected to the first layer by a series capacitor and begins at A and winds up to D. Also shown is the control coil 606 wound around the first coil 604 in a single layer beginning at F and ending at E or vice versa. Although a particular number of layers and windings are shown, they are non-limiting examples and any number of windings and layers are contemplated. The diagram 1400 shows a series circuit including, in order, a first terminal T1, a first capacitor, a first equivalent voltage source of 325V and a first inductance together corresponding to the first layer of windings of the first coil 604 between B and C, a second capacitor between C and A, a second equivalent voltage source of 325V and a second inductance together corresponding to the second layer of windings of the first coil 604 between A and D, and a second terminal T2. Here, because the circuit is series connected, the first and second capacitors each have double the capacitance and may have half the voltage rating compared to the resonance capacitor 608 shown in FIG. 13. Thus, there is a series capacitor before the first layer of windings and a capacitor between each layer, where the total capacitance adds to the single capacitor value of FIG. 13.

In the implementation shown in FIG. 14, the voltage between layers of windings is reduced to $V_{oc}/2$ or 325V rather than 1.3 kV as in FIG. 13, with the voltage across the terminals T1 and T2 still 650V and the resonant current still 25 A in phase with $V_{oc}$. As shown in the voltage plot 1450 at T1 the voltage is 0V and drops to −1013V at the other side of the first capacitor at B. The voltage then rises by 325V to −688V at the first equivalent voltage source and then rises from −688V to 325V across the first equivalent inductance of the first winding between B and C. The voltage then drops back to −688V across the second capacitor at A. In the second winding between A and D, the voltage rises again from −688V to −363V at the second equivalent voltage source and then rises from −363V to 650V across the second equivalent inductance of the second winding between A and D. The placement of a series capacitor before each layer of windings substantially reduces voltage stresses compared to the implementation of FIG. 13 and allows the use of lower voltage semiconductor switches where such switches may fail if used in the implementation of FIG. 13.

Figure 15:
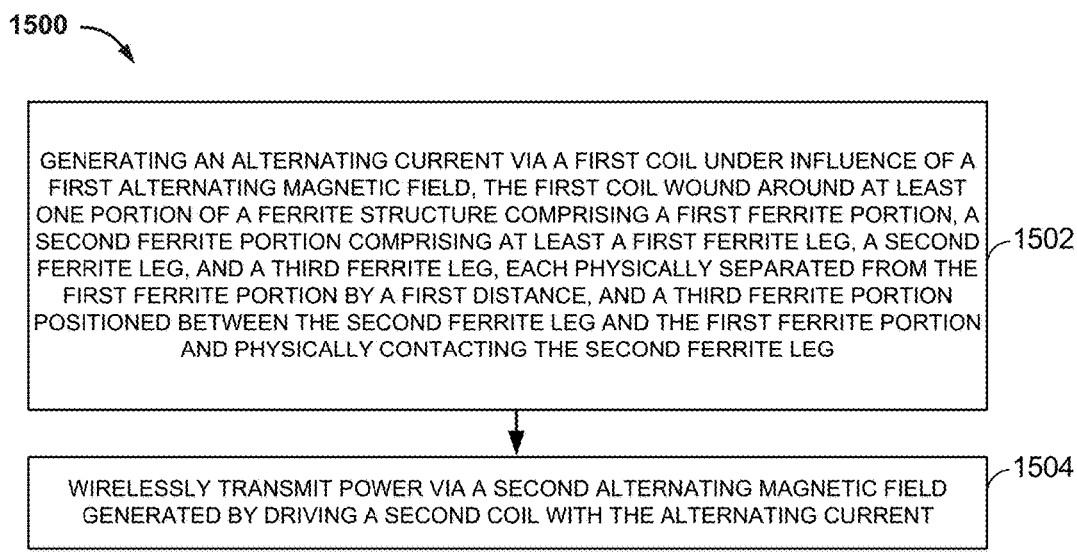
FIG. 15 is a flowchart depicting a method for transmitting charging power wirelessly to a load, in accordance with some implementations.

FIG. 15 is a flowchart 1500 depicting a method for transmitting charging power wirelessly to a load, in accordance with some implementations. Although blocks may be described as occurring in a certain order, the blocks can be reordered, blocks can be omitted, and/or additional blocks can be added.

The flowchart 1500 may begin with block 1502, which includes generating an alternating current via a first coil under influence of a first alternating magnetic field, the first coil wound around at least one portion of a ferrite structure comprising a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg. For example, as previously described in connection with any of FIGS. 7, 8, 10 and 12, the first coil 604 is configured to generate an alternating current under influence of a first alternating magnetic field. As shown, the first coil 604 is wound around at least one portion of the ferrite structure 700, 800, 1000, 1200 comprising the first ferrite portion 704, the second ferrite portion 702 comprising at least the first ferrite leg 716, the second ferrite leg 718, and the third ferrite leg 720, each physically separated from the first ferrite portion 704 by the first distance "d", and the third ferrite portion 712 positioned between the second ferrite leg 718 and the first ferrite portion 704 and physically contacting the second ferrite leg 718.

In some implementations, the first ferrite portion 704 may also be known as, or comprise at least a portion of first means for channeling magnetic flux. In some implementations, the second ferrite portion 702 may also be known as, or comprise at least a portion of second means for channeling magnetic flux. In some implementations, the third ferrite portion 712 may also be known as, or comprise at least a portion of third means for channeling magnetic flux. In some implementations, the first coil 604 may also be known as, or comprise at least a portion of means for generating an alternating current under influence of an alternating magnetic field.

In some implementations, the first alternating magnetic field is generated by at least one of a first conductor 708 of an alternating current power backbone 430 disposed in a first space between the first ferrite leg 716 and the second ferrite leg 718, and a second conductor 710 of the alternating current power backbone 430 disposed in a second space between the second ferrite leg 718 and the third ferrite leg 720. In some implementations, the first conductor 708 of an alternating current power backbone 430 may also be known as, or comprise at least a portion of first means for conducting an alternating current through a power backbone. In some implementations, second conductor 710 of the alternating current power backbone 430 may also be known as, or comprise at least a portion of second means for conducting the alternating current through the power backbone.

In some implementations, the first coil 604 is wound around the second ferrite leg 718 of the ferrite structure 800 and around a second ferrite leg 718 of at least one other ferrite structure 800 substantially the same as the ferrite structure 800. In some implementations, as previously described in connection with FIG. 14, the first coil 604 comprises a plurality of layers of windings and a respective capacitor (e.g., shown as the capacitor between points C and A) connected in series between each layer of the plurality of layers of windings.

The flowchart 1500 continues with block 1504, which includes wirelessly transmitting power via a second alternating magnetic field generated by driving a second coil with the alternating current. For example, as previously described in connection with FIG. 6, the double couple transformer 600 wirelessly transmits power via a second alternating magnetic field (not shown) generated by driving the second coil 614 with the alternating current generated by the first coil 604 under influence of the first alternating magnetic field generated by the first conductor 708 and the second conductor 710 of the AC power backbone 430.

Figure 16:
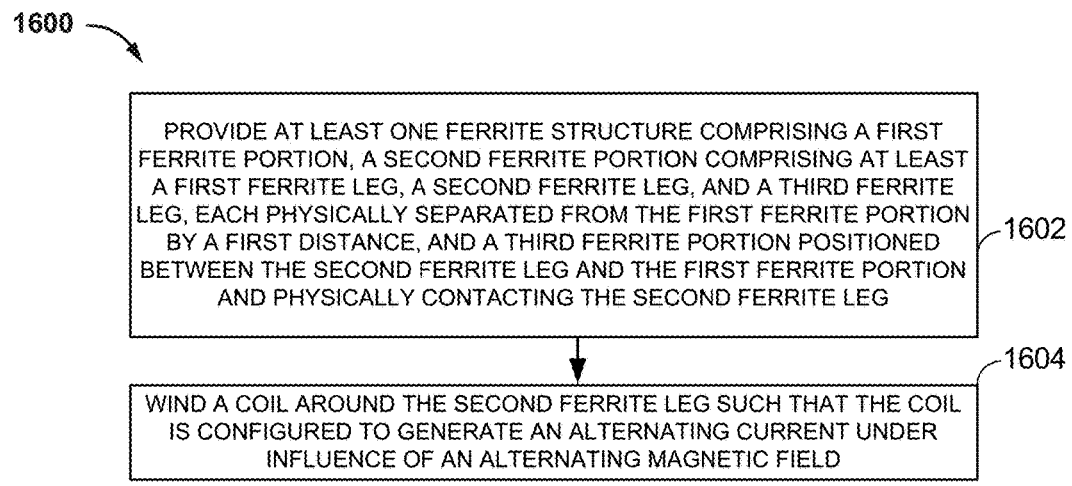
FIG. 16 is a flowchart depicting a method of manufacturing a double couple transformer configured to transmit charging power wirelessly to a vehicle, in accordance with an exemplary implementation.

FIG. 16 is a flowchart 1600 depicting a method of manufacturing a double couple transformer configured to transmit charging power wirelessly to a vehicle, in accordance with some implementations. Although blocks may be described as occurring in a certain order, the blocks can be reordered, blocks can be omitted, and/or additional blocks can be added.

The flowchart 1600 may begin with block 1602, which includes providing at least one ferrite structure comprising a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg. For example, as previously described in connection with any of FIGS. 7, 8, 10 and 12, the ferrite structure 700, 800, 1000, 1200 comprises a first ferrite portion 704, a second ferrite portion 702 comprising at least a first ferrite leg 716, a second ferrite leg 718, and a third ferrite leg 720, each physically separated from the first ferrite portion 704 by a first distance "d", and a third ferrite portion 712 positioned between the second ferrite leg 718 and the first ferrite portion 704 and physically contacting the second ferrite leg 718.

The flowchart 1600 may continue with block 1604, which includes winding a coil around the second ferrite leg such that the coil is configured to generate an alternating current under influence of an alternating magnetic field. For example, as previously described in connection with any of FIGS. 7, 8, 10 and 12, the first coil 604 is wound around the second ferrite leg 718 such that the first coil 604 is configured to generate an alternating current under influence of an alternating magnetic field.

In some implementations, the flowchart 1600 may further comprise disposing a first conductor 708 of an alternating current power backbone 430 in a first space between the first ferrite leg 716 and the second ferrite leg 718 and disposing a second conductor 710 of the alternating current power backbone 430 in a second space between the second ferrite leg 718 and the third ferrite leg 720.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC.

For purposes of summarizing the disclosure, certain aspects, advantages and novel features have been described herein. It is to be understood that not necessarily all such advantages may be achieved in accordance with any particular implementation. Thus, one or more implementations achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for transmitting charging power wirelessly to a load, the apparatus comprising:
   at least one ferrite structure comprising:
      a first ferrite portion,
      a second ferrite portion comprising at least a first ferrite leg, a second ferrite leg, and a third ferrite leg, each physically separated from the first ferrite portion by a first distance, and
      a third ferrite portion positioned between the second ferrite leg and the first ferrite portion and physically contacting the second ferrite leg;
   a coil wound around the second ferrite leg and configured to generate an alternating current under influence of an alternating magnetic field, the coil comprising at least a first winding wound in a first layer around the second ferrite leg and a second winding wound in a second layer around the first layer, the first layer connected to the second layer by a capacitor; and
   a control coil wound in a third layer around the coil.

2. The apparatus of claim 1, wherein:
   a first air gap separates the first ferrite leg and the first ferrite portion,
   a second air gap separates the third ferrite portion and the first ferrite portion, a third air gap separates the third ferrite leg and the first ferrite portion, and the second air gap is smaller than each of the first air gap and the third air gap.

3. The apparatus of claim 2, wherein:

a first reluctance path passes through the first ferrite portion, the first air gap, the second ferrite portion, the third ferrite portion and the second air gap, a second reluctance path passes through the first ferrite portion, the third air gap, the second ferrite portion, the third ferrite portion and the second air gap, a third reluctance path passes through the first ferrite portion, the first air gap, the second ferrite portion, and the third air gap, and the third reluctance path provides a higher magnetic reluctance compared to either the first reluctance path and the second reluctance path.

4. The apparatus of claim 3, wherein a first magnetic flux flowing in the third reluctance path is less than a second magnetic flux flowing in the first reluctance path and less than a third magnetic flux flowing in the second reluctance path.

5. The apparatus of claim 1, wherein the at least one ferrite structure comprises a plurality of ferrite structures each substantially the same as the at least one ferrite structure.

6. The apparatus of claim 1, wherein the coil comprises a plurality of layers of windings and a respective capacitor connected in series between each layer of the plurality of layers of windings.

7. The apparatus of claim 1, wherein the first ferrite portion comprises a plurality of interleaved I-shaped ferrite tiles physically separated by a fourth gap, and the second ferrite portion comprises a plurality of interleaved U-shaped ferrite tiles physically separated by a fifth gap.

8. The apparatus of claim 1, further comprising a second coil configured to be driven by the alternating current and wirelessly transmit charging power to the load, the load comprising an electric vehicle.

9. The apparatus of claim 1, wherein the control coil is configured to reduce or prevent generation of the alternating current in the coil in a first configuration, and to allow generation of the alternating current in the coil in a second configuration.

10. The apparatus of claim 9, wherein the control coil includes a switch configured to selectively short-circuit or open-circuit the control coil to switch between the first configuration and the second configuration.

11. The apparatus of claim 1, wherein the alternating magnetic field is generated by at least one of:

a first conductor of an alternating current power backbone disposed in a first space between the first ferrite leg and the second ferrite leg; and a second conductor of the alternating current power backbone disposed in a second space between the second ferrite leg and the third ferrite leg.

12. A method for transmitting charging power wirelessly to a load, the method comprising:

generating an alternating current via a first coil under influence of a first alternating magnetic field, the first coil wound around at least one portion of a ferrite structure comprising:

a first ferrite portion, a second ferrite portion comprising at least a first ferrite leg, a second ferrite leg, and a third ferrite leg, each physically separated from the first ferrite portion by a first distance, and a third ferrite portion positioned between the second ferrite leg and the first ferrite portion and physically contacting the second ferrite leg; and wirelessly transmitting power via a second alternating magnetic field generated by driving a second coil with the alternating current, wherein one of the first and second coils comprises at least a first winding wound in a first layer around the second ferrite lea and a second winding wound in a second layer around the first layer and has a control coil wound in a third layer around the first or second coil comprising the first and second windings, the first layer connected to the second layer by a capacitor.

13. The method of claim 12, wherein:

a first air gap separates the first ferrite leg and the first ferrite portion, a second air gap separates the third ferrite portion and the first ferrite portion, a third air gap separates the third ferrite leg and the first ferrite portion, and the second air gap is smaller than each of the first air gap and the third air gap.

14. The method of claim 13, wherein:

a first reluctance path passes through the first ferrite portion, the first air gap, the second ferrite portion, the third ferrite portion and the second air gap, a second reluctance path passes through the first ferrite portion, the third air gap, the second ferrite portion, the third ferrite portion and the second air gap, a third reluctance path passes through the first ferrite portion, the first air gap, the second ferrite portion, and the third air gap, and the third reluctance path passing provides a higher magnetic reluctance compared to either the first reluctance path and the second reluctance path.

15. The method of claim 14, wherein a first magnetic flux flowing in the third reluctance path is less than a second magnetic flux flowing in the first reluctance path and less than a third magnetic flux flowing in the second reluctance path.

16. The method of claim 12, wherein the first coil is wound around the second ferrite leg of the ferrite structure and around a second ferrite leg of at least one other ferrite structure substantially the same as the ferrite structure.

17. The method of claim 12, wherein the first coil comprises a plurality of layers of windings and a respective capacitor connected in series between each layer of the plurality of layers of windings.

18. The method of claim 12, wherein the load comprises an electric vehicle configured to receive wireless charging power from the second alternating magnetic field.

19. The method of claim 12, further comprising selectively:

short-circuiting the control coil wound around the at least one portion of the ferrite structure to reduce or prevent generation of the alternating current in the coil; and open-circuiting the control coil to allow generation of the alternating current in the coil.

20. The method of claim 19, wherein said selectively short-circuiting and open-circuiting the control coil comprises selectively opening and closing a switch.

21. The method of claim 12, wherein the first alternating magnetic field is generated by at least one of:

a first conductor of an alternating current power backbone disposed in a first space between the first ferrite leg and the second ferrite leg; and a second conductor of the alternating current power backbone disposed in a second space between the second ferrite leg and the third ferrite leg.

22. An apparatus for transmitting charging power wirelessly to a load, the apparatus comprising:
first means for channeling magnetic flux;
second means for channeling magnetic flux comprising at least a first leg, a second leg, and a third leg, each physically separated from the first means for channeling magnetic flux by a first distance, and the second leg being located between the first leg and the third leg;
third means for channeling magnetic flux positioned between the second leg and the first means for channeling magnetic flux and physically contacting the second leg;
means for generating an alternating current under influence of an alternating magnetic field wound around the second leg, the generating means comprising at least a first winding wound in a first layer around the second ferrite leg and a second winding wound in a second layer around the first layer, the first layer connected to the second layer by a capacitor; and
means for reducing or preventing generation of the alternating current wound in a third layer around the means for generating an alternating current under influence of an alternating magnetic field.

23. The apparatus of claim 22, wherein:
a first air gap separates the first leg and the first means for channeling magnetic flux,
a second air gap between the third means for channeling magnetic flux and the first means for channeling magnetic flux,
a third air gap between the third leg and the first means for channeling magnetic flux, and
the second air gap is smaller than each of the first air gap and the third air gap.

24. The apparatus of claim 23, wherein:
a first reluctance path passes through the first means for channeling magnetic flux, the first air gap, the second means for channeling magnetic flux, the third means for channeling magnetic flux and the second air gap,
a second reluctance path passes through the first means for channeling magnetic flux, the second air gap, the second means for channeling magnetic flux and the third air gap,
a third reluctance path passes through the first means for channeling magnetic flux, the first air gap, the second means for channeling magnetic flux, and the third air gap, and the third reluctance path provides a higher magnetic reluctance compared to either the first reluctance path and the second reluctance path.

25. The apparatus of claim 24, wherein a first magnetic flux flowing in the third reluctance path is less than a second magnetic flux flowing in the first reluctance path and less than a third magnetic flux flowing in the second reluctance path.

26. A method for manufacturing a double couple transformer configured to transmit charging power wirelessly to a vehicle, the method comprising:
providing at least one ferrite structure comprising:
a first ferrite portion,
a second ferrite portion comprising at least a first ferrite leg, a second ferrite leg, and a third ferrite leg, each physically separated from the first ferrite portion by a first distance, and
a third ferrite portion positioned between the second ferrite leg and the first ferrite portion and physically contacting the second ferrite leg;
winding a coil around the second ferrite leg such that the coil is configured to generate an alternating current under influence of an alternating magnetic field, the coil comprising at least a first winding wound in a first layer around the second ferrite leg and a second winding wound in a second layer around the first layer, the first layer connected to the second layer by a capacitor; and
winding a control coil in a third layer around the coil.

27. The method of claim 26, further comprising:
disposing a first conductor of an alternating current power backbone in a first space between the first ferrite leg and the second ferrite leg; and
disposing a second conductor of the alternating current power backbone in a second space between the second ferrite leg and the third ferrite leg.

28. The method of claim 27, further comprising providing at least one other ferrite structure substantially the same as the at least one ferrite structure.

29. The method of claim 27, further comprising connecting a capacitor in series between each layer of windings of the coil.

30. The method of claim 27, further comprising providing the first ferrite portion with a plurality of interleaved I-shaped ferrite tiles physically separated by a fourth gap, and providing the second ferrite portion with a plurality of interleaved U-shaped ferrite tiles physically separated by a fifth gap.

* * * * *